(12) United States Patent
Maruyama

(10) Patent No.: US 7,246,292 B2
(45) Date of Patent: Jul. 17, 2007

(54) APPARATUS AND METHOD FOR BIT PATTERN LEARNING AND COMPUTER PRODUCT

(75) Inventor: Daisuke Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 286 days.

(21) Appl. No.: 11/093,244

(22) Filed: Mar. 30, 2005

(65) Prior Publication Data

US 2006/0156103 A1    Jul. 13, 2006

(30) Foreign Application Priority Data

Dec. 20, 2004   (JP) .............................. 2004-367668

(51) Int. Cl.
*G06F 11/00* (2006.01)
(52) U.S. Cl. ...................... 714/738; 714/785
(58) Field of Classification Search ............... 382/100, 382/161; 704/244, 245; 706/41; 714/738, 714/785
See application file for complete search history.

(56) References Cited

U.S. PATENT DOCUMENTS

| | | | | |
|---|---|---|---|---|
| 4,254,399 A | * | 3/1981 | Burkhardt et al. ........... 382/100 |
| 4,651,289 A | * | 3/1987 | Maeda et al. ................ 704/244 |
| 4,805,225 A | * | 2/1989 | Clark ........................... 382/161 |
| 4,827,522 A | * | 5/1989 | Matsuura et al. ............ 704/245 |
| 5,524,175 A | * | 6/1996 | Sato et al. ..................... 706/41 |
| 6,130,625 A | * | 10/2000 | Harvey .................. 340/825.72 |
| 6,275,799 B1 | * | 8/2001 | Iso .............................. 704/244 |

FOREIGN PATENT DOCUMENTS

JP            5-5774        1/1993

* cited by examiner

*Primary Examiner*—David Ton
(74) *Attorney, Agent, or Firm*—Staas & Halsey LLP

(57) ABSTRACT

A computer calculates bit patterns of syndromes for all candidate bit patterns of reception words that are input in ECC-EOR circuits of a logic circuit. The bit patterns of the syndromes are stored as possible bit patterns. Request bit patterns are propagated when an error occurs, and are allocated to the syndromes. Implication processing is performed, and the request bit patterns are compared with the possible bit patterns.

18 Claims, 15 Drawing Sheets

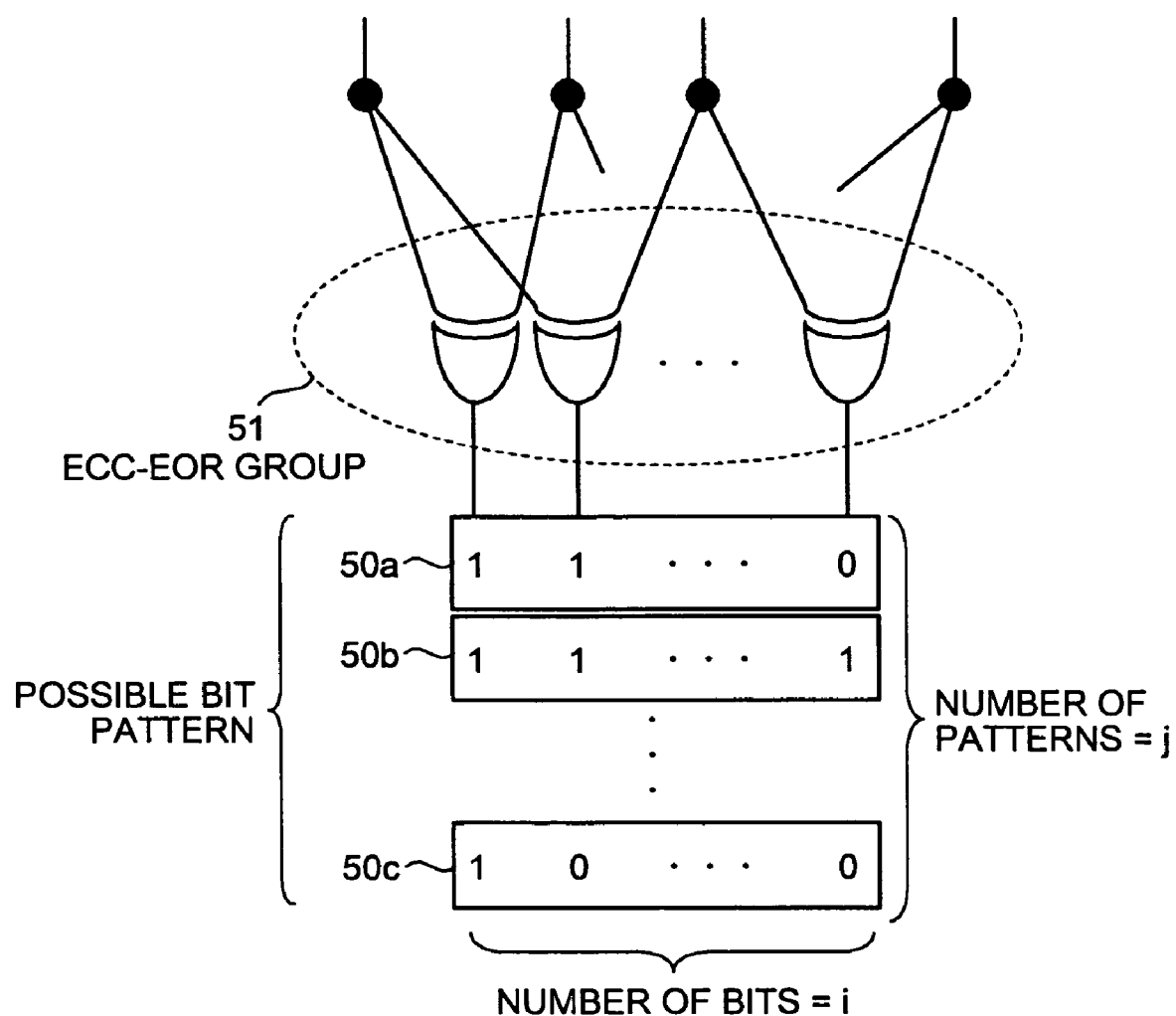

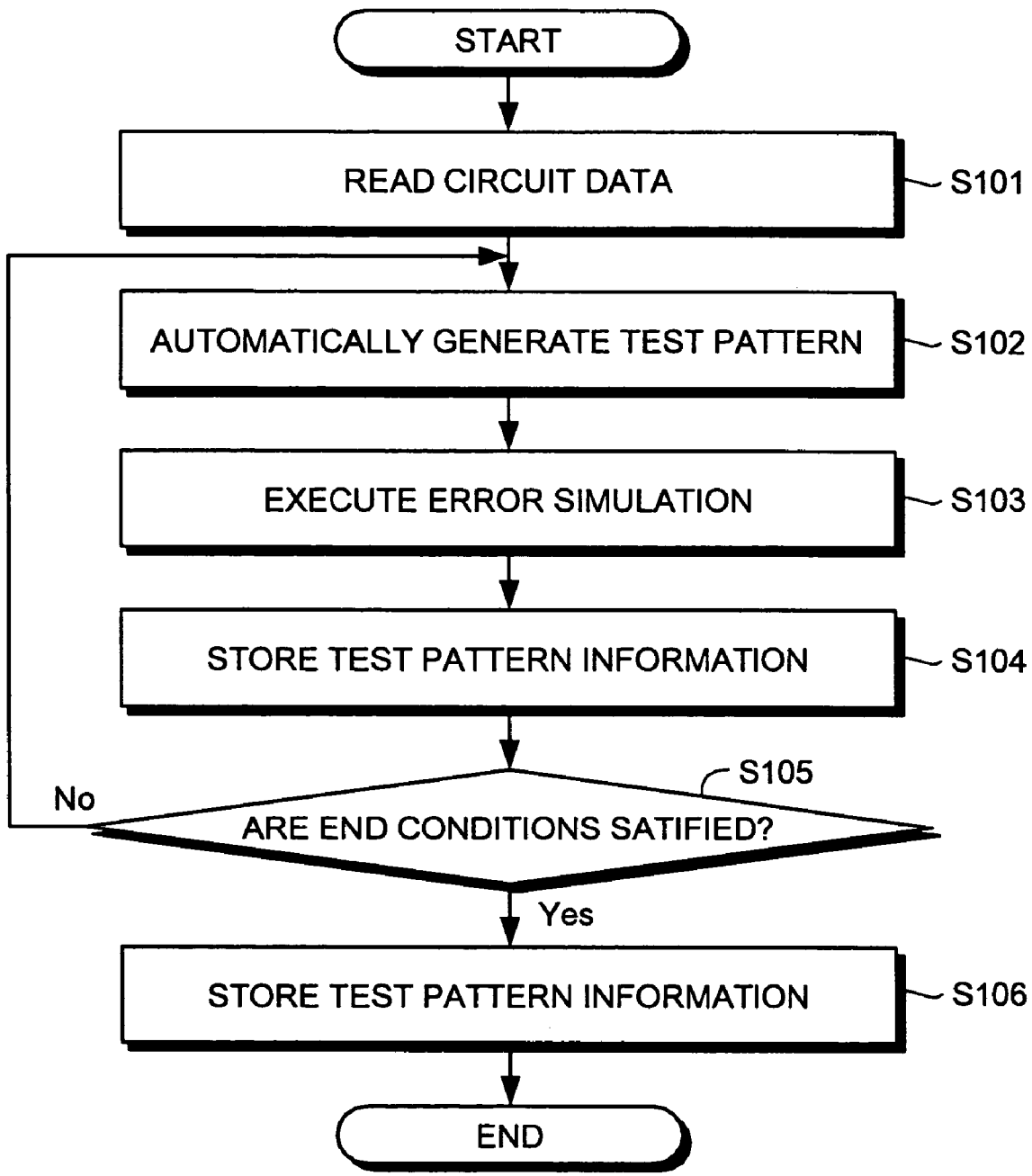

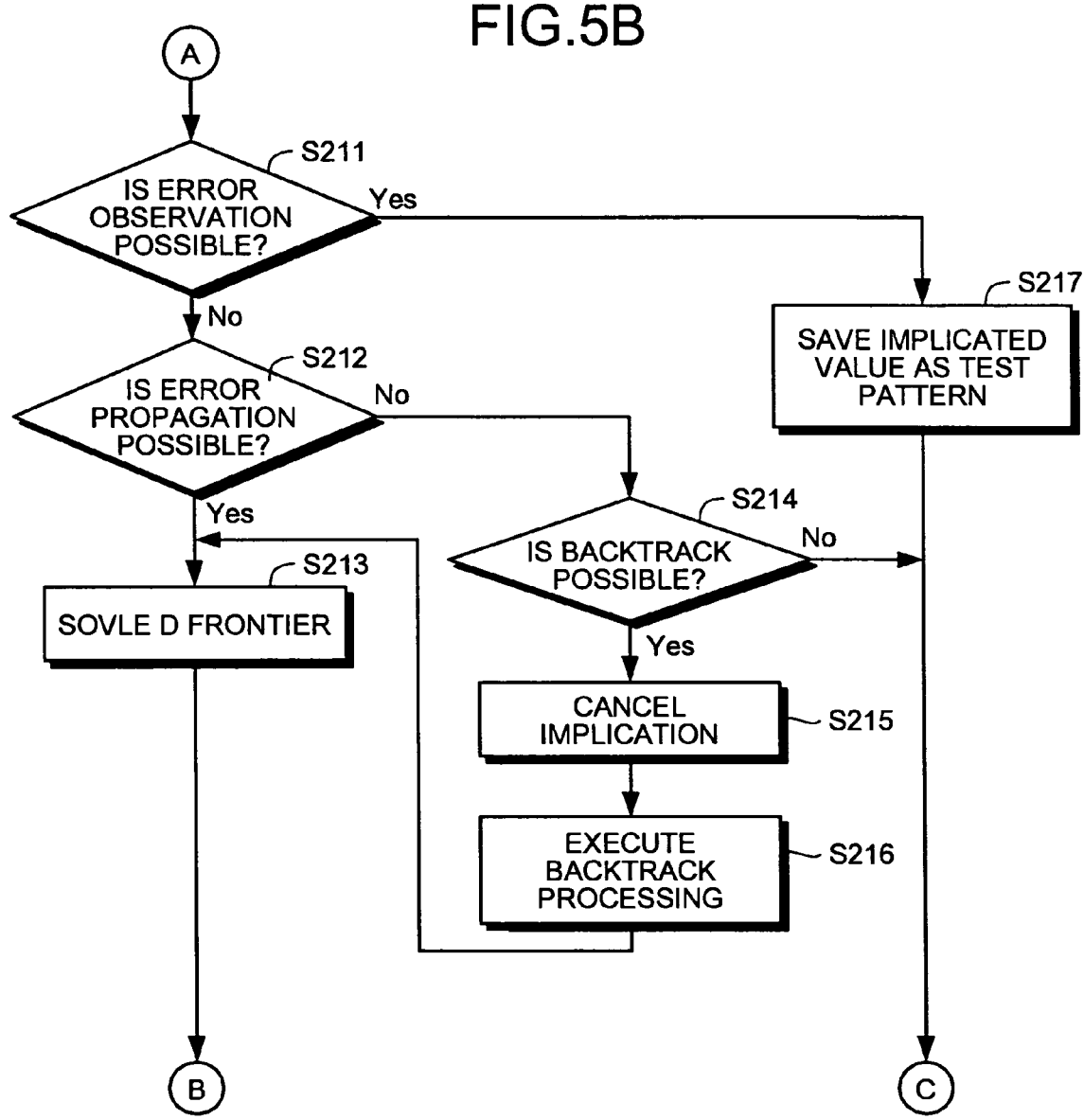

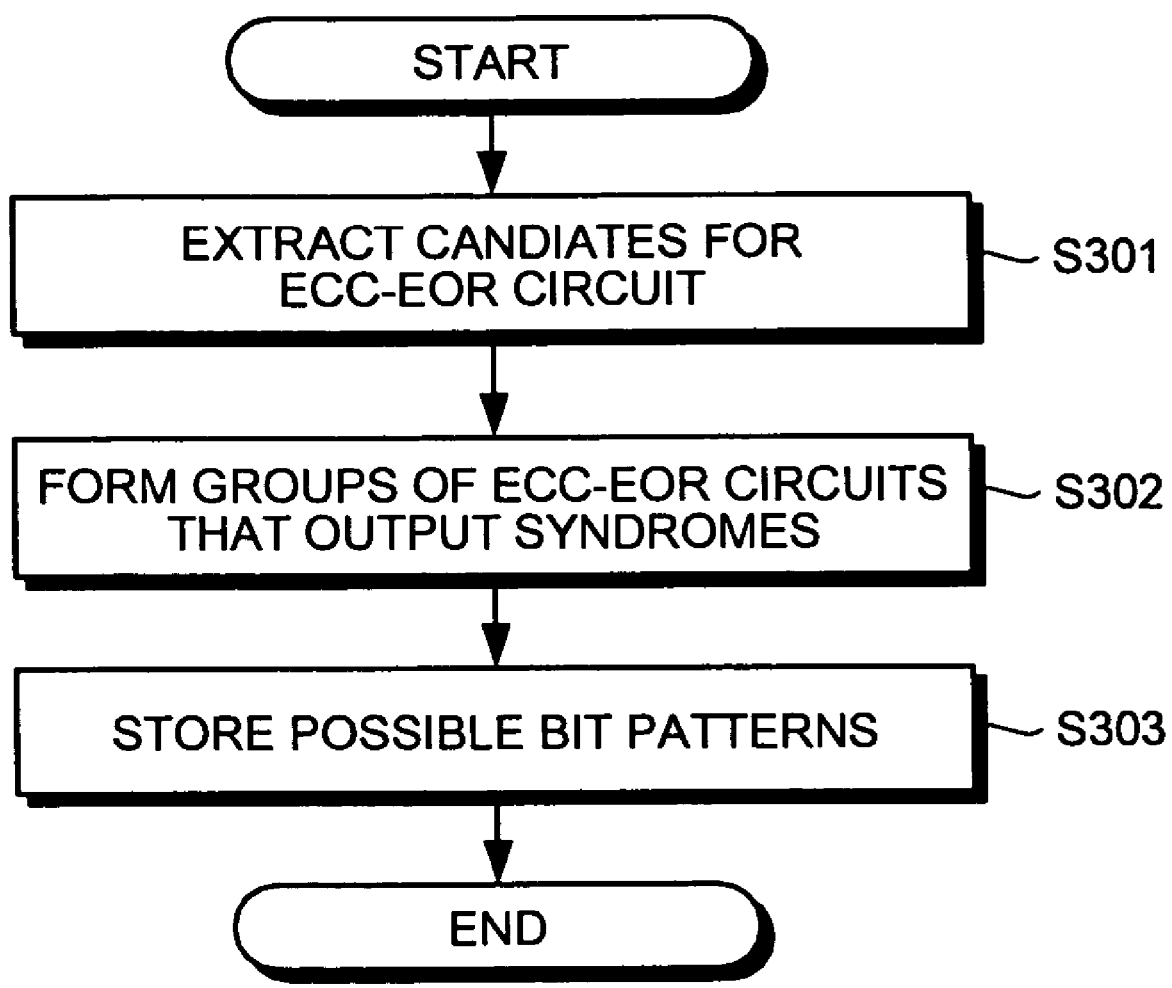

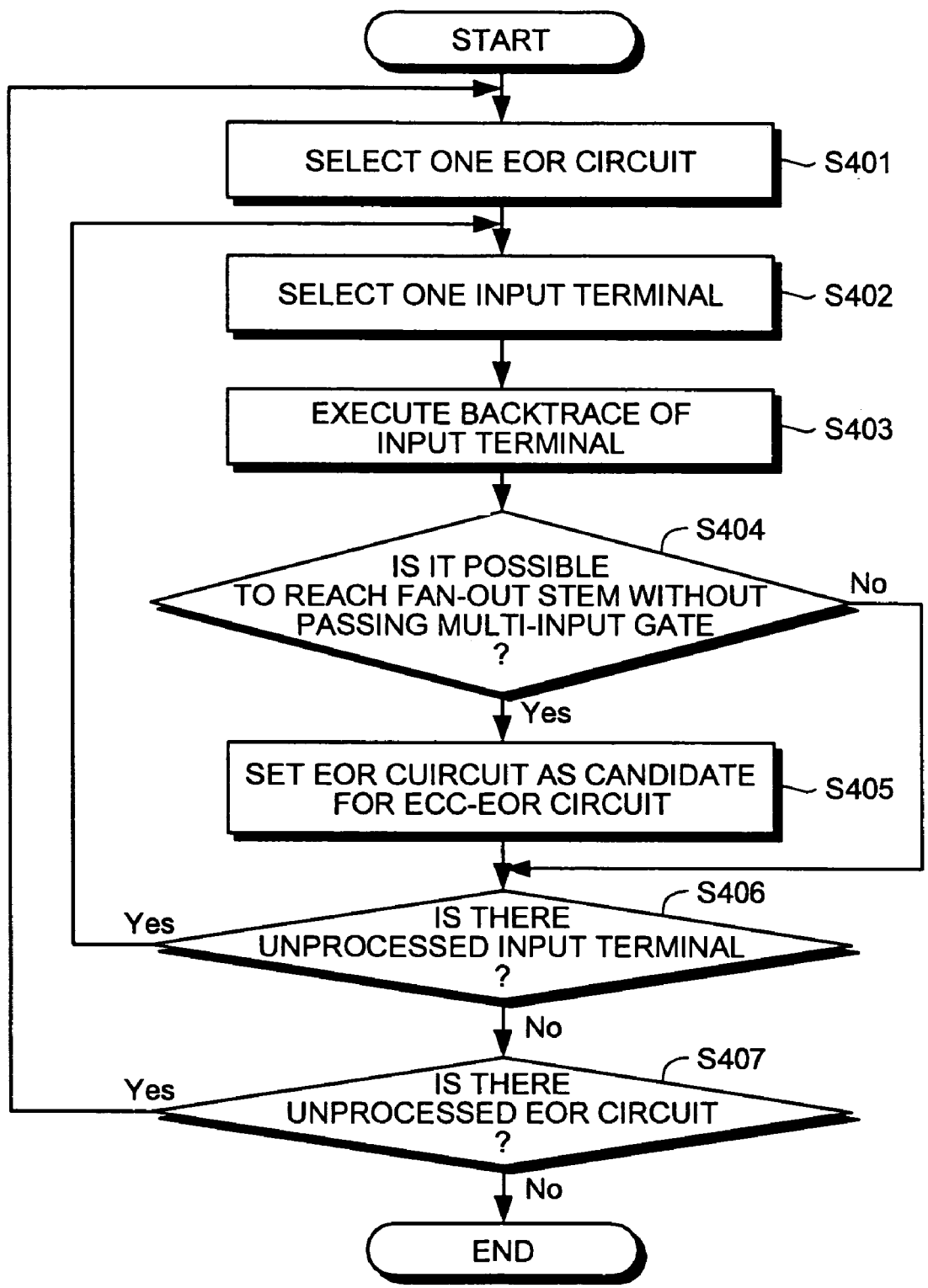

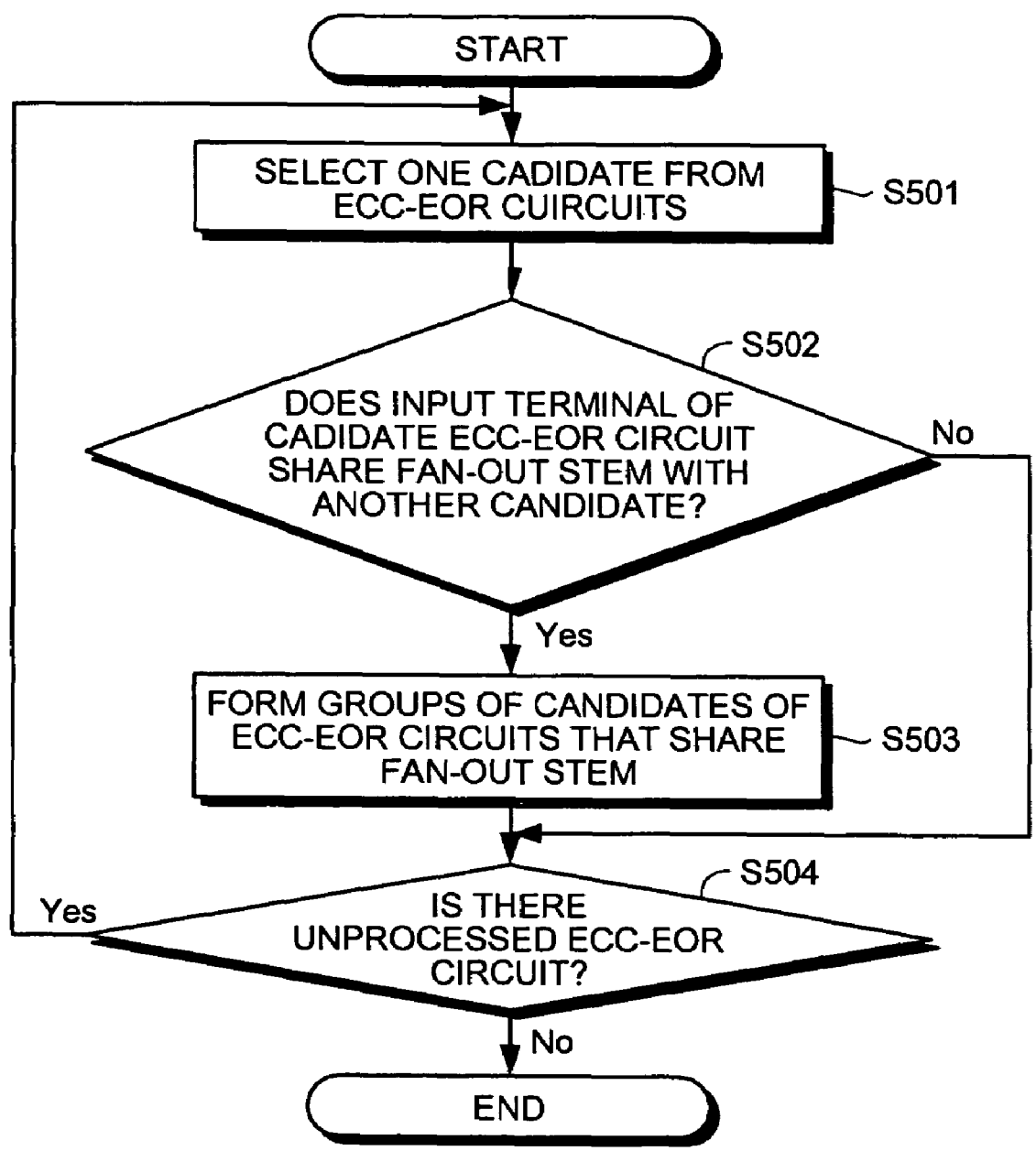

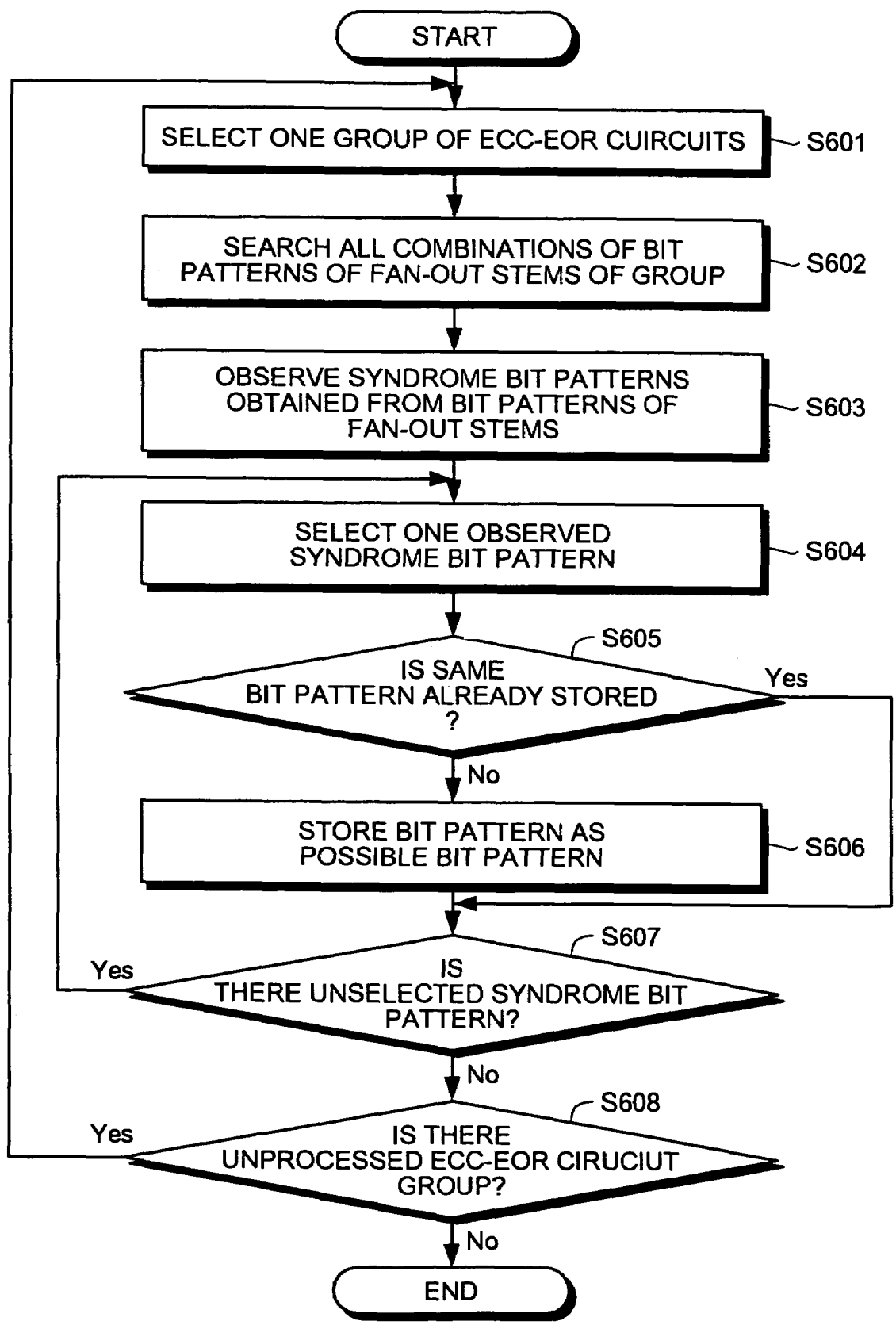

APPARATUS AND METHOD FOR BIT PATTERN LEARNING AND COMPUTER PRODUCT

BACKGROUND OF THE INVENTION

1) Field of the Invention

The present invention relates to a technology for generating a test pattern to detect an error in a logic circuit.

2) Description of the Related Art

Test patterns are used to detect errors in logic circuits. Such test patterns can be generated automatically by using a tool called Automatic Test Pattern Generation (hereinafter, "ATPG"), if the structure of the logic circuit is given.

However, it takes a very long time for the ATPG to generate the test pattern if the circuit is large scale. A method to solve this problem is disclosed in Japanese Patent-Application Laid-Open Publication No. H5-5774. With this method, a test pattern is easily generated by cutting out only the relevant section of the circuit, and then simplifying the cut out section.

There are also other approaches, such as a method of generating a test pattern by static learning/dynamic learning, or learning based on observability/controllability. The static learning/dynamic learning method performs implication processing, so that an arbitrary net-a (input value) determines a logic value for a net-b (output value) in the circuit, and a computer learns the relationship between net-a and net-b. Hence, the number of combinations of logic values can be reduced.

In a complex circuit, a contradiction is often found during the implication processing. The observability/controllability-based learning method performs implication processing from a section where such a contradiction is easily observable or from a complex section, so as to determine at an early stage whether the test pattern can be generated.

However, the known methods are inefficient or inapplicable when generating a test pattern for an error correcting circuit (hereinafter, "ECC"), which is typically used in a Random Access Memory (hereinafter, "RAM"), or a latch circuit, etc.

Specifically, the ECC includes a plurality of Exclusive OR (hereinafter, "EOR") circuits that share a common input value. Therefore, it cannot be determined whether a request value of the EOR circuits generated in the implication processing, contradicts with output values corresponding to a certain input value of the EOR circuits.

FIG. 14 is an example of the ECC. The ECC includes a syndrome computing section 1 and a corrected-data computing section 2. The syndrome computing section 1 includes EOR circuits 3a to 3c and calculates a syndrome s from a reception word y. The corrected-data computing section 2 uses all of the bit components of the-syndrome s, to calculate a corrected data word m.

The syndrome s is obtained from the following equation:

$$S = H \cdot y^t (\bmod 2)$$

where y is a reception word vector that is input to the syndrome computing section 1, H is an inspection matrix of the syndrome computing section 1, $y^t$ is a transposed vector of vector y, and mod 2 is a remainder operator having a modulus of 2.

For example, a test pattern to detect an error in a signal line in the corrected-data computing section 2 is generated as follows. When the error propagates, a request value $s_r$ is generated. Then, the logic value corresponding to the reception word y, is searched for the request value $S_r$.

However, the reception word y is partially shared by the EOR circuits 3a to 3c. Therefore, the EOR circuits 3a to 3c cannot independently determine an output value. Moreover, the EOR circuits 3a to 3c cannot determine an output value unless all input values are determined. Thus, a contradiction cannot be immediately detected between an output value (syndrome) $s_y$ calculated from the input value of the reception word y, and the request value $s_r$.

Specifically, in the test-pattern generation processing, a logic value is determined for an-arbitrary net in an EOR circuit, into which a reception word y of n bits is input. Here, it is required to determine an input value of n–i bits (i ranges from 1 to n–1, according to the configuration of the inspection matrix H). Otherwise, a contradiction between the request value $s_r$ and the output value $s_y$ cannot be detected surely.

When a contradiction is detected by the implication processing for the reception word y, the implication processing is continued by performing backtrack. However, if the request value $s_r$ contradicts with the output value $s_y$ in the first place, the search needs to be executed $2^{n-1}$ times until the contradiction is detected. Consequently, the processing takes a very long time if the number of bits n is large.

In the static/dynamic learning method, the output value from the EOR circuit cannot be determined unless all of the input values are determined. Therefore, even if a certain bit value of the reception word y is set as a bit value of net-a, net-b does not exist. Accordingly, there are no relationships for the computer to learn, until all input values are determined.

As to the observability/controllability-based learning method, the order of the implication processing can be changed. However, it is meaningless to change the order because the output value cannot be determined unless all input values are determined.

It is therefore imperative to achieve an efficient method of generating a test pattern to detect an error in a logic circuit such as the ECC that includes an EOR circuit.

SUMMARY OF THE INVENTION

It is an object of the present invention to at least solve the problems in the conventional technology.

According to one aspect of the present invention, a computer-readable recording medium stores therein a computer program that causes a computer to execute calculating output bit patterns for all candidate bit patterns that are input in a logic circuit; and storing the output bit patterns calculated, thereby learning the output bit patterns.

According to another aspect of the present invention, a bit-pattern learning apparatus includes a calculating unit that calculates output bit patterns for all candidate bit patterns, wherein the candidate bit patterns are input in a logic circuit; and a storing unit that stores the output bit patterns calculated, thereby causing a computer to learn the output bit patterns.

According to still another aspect of the present invention, a bit-pattern learning method includes calculating output bit patterns for all candidate bit patterns that are input in a logic circuit; and storing the output bit patterns calculated, thereby learning the output bit patterns.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3 describes possible bit patterns;

FIG. 4 is a flowchart of a test-pattern generation processing;

FIGS. 5A and 5B are flowcharts of a test-pattern automatic generation processing;

FIG. 6 is a flowchart of a possible-bit-pattern learning processing;

FIG. 7 is a flowchart of a candidate ECC-EOR circuit extraction processing;

FIG. 8 is a flowchart of an ECC-EOR circuit grouping processing;

FIG. 9 is a flowchart of a possible-bit-pattern storing processing;

DETAILED DESCRIPTION

Exemplary embodiments of the present invention will be described below with reference to accompanying drawings.

Figure 1:
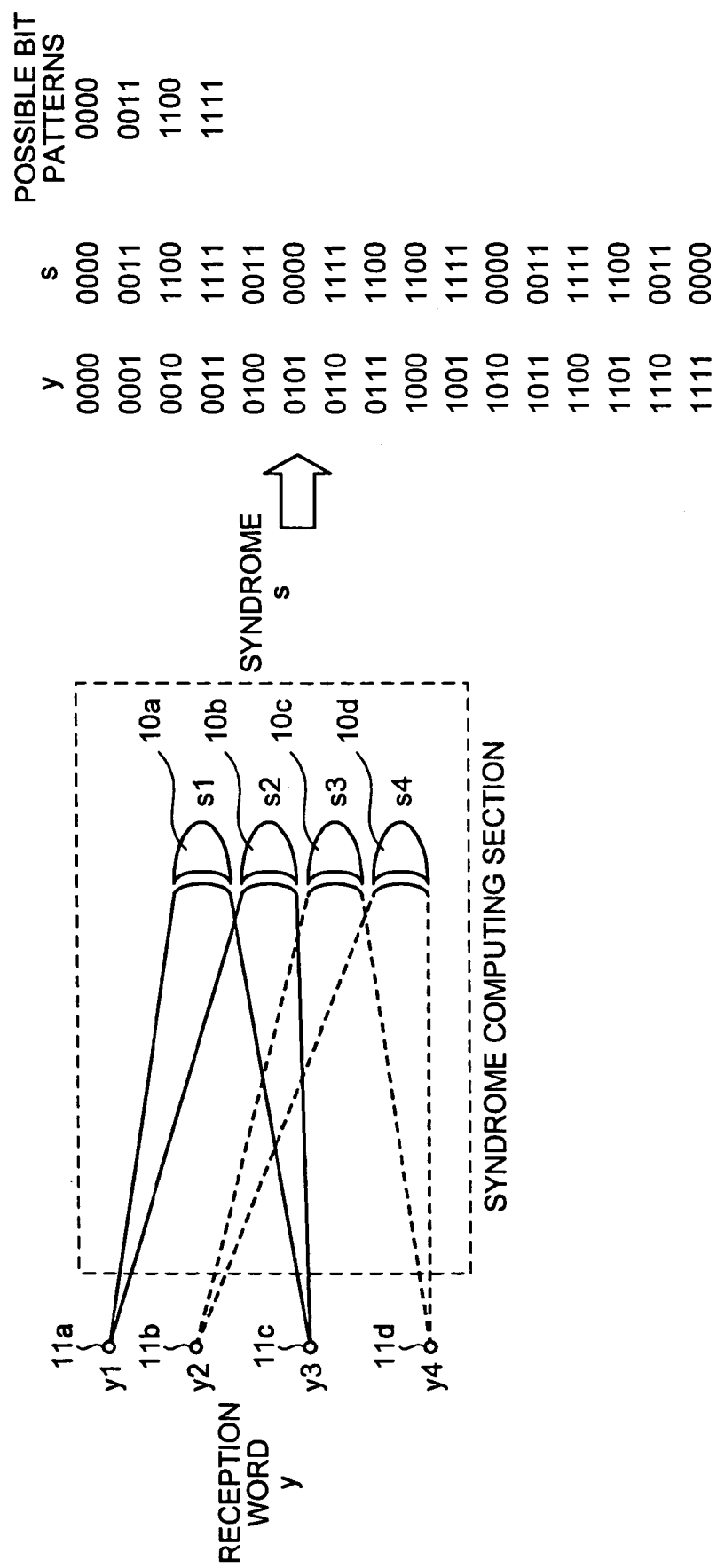
FIG. 1 is a conceptual diagram of a bit-pattern learning processing according to the present invention.

First, the concept of bit-pattern learning processing is described below. As shown in FIG. 1, it is assumed that a syndrome computing section includes four Exclusive OR (hereinafter, "EOR") circuits $10a$ to $10d$. Each EOR circuit shares a fan-out stem $11a$ to $11d$ with another EOR circuit.

A test pattern is generated by the bit-pattern learning processing as follows. A reception word y is allocated to each fan-out stem $11a$ to $11d$. A syndrome s is calculated from each of the reception words y. Specifically, a bit pattern of the syndrome s is obtained for a bit pattern of the reception word y. All of the bit patterns of the reception words y and the corresponding bit patterns of the syndrome s are shown in FIG. 1.

If the number of bits of the reception word y is n and the number of bits of the syndrome s is m, a degree of freedom n' of the number of bits of the syndrome s can reduce to $n' \leq n$. This is because each EOR circuit shares a fan-out stem with another EOR circuit.

In the example shown in FIG. 1, n=m=4. Therefore, there are $2^4=16$ bit patterns of the reception words y, while only four bit patterns are generated for the syndromes s. Accordingly, the degree of freedom reduces to n'=2.

A computer learns the bit patterns generated for the syndromes s as possible bit patterns for the syndromes s. When a request bit pattern for the syndrome s is generated by the test pattern, the computer determines whether the same bit pattern as the request bit pattern is included among the possible bit patterns. If not, it is determined that the request bit pattern contradicts with the syndromes s.

As the computer can immediately determine whether a request value (request bit pattern) contradicts with the syndromes s, the test pattern is generated efficiently. Moreover, there is no need to wait until all of the bit values of the request bit pattern are generated. As soon as the computer recognizes that a bit value of the request bit pattern does not match the bit value in the same position of any of the possible bit patterns, the request bit pattern is immediately determined as not included among the possible bit patterns.

Next, a bit-pattern learning apparatus according to an embodiment of the present invention is described, below with reference to FIG. 2.

The bit-pattern learning apparatus includes an input section 20, a display section 21, a circuit-data reading section 22, a circuit-data writing section 23, a circuit-data storing section 24, a test-pattern generating section 25, a possible-bit-pattern data storing section 37, an error-simulation execution section 38, a test-pattern-data storing section 39, a test-pattern-data reading section 40, and a control section 41.

The input section 20 is an input device such as a keyboard or a mouse. The display section 21 is a display device such as a screen. The circuit-data reading section 22 reads circuit data from the circuit-data storing section 24, including data such as a circuit structure or a list of errors that are objects of the test pattern.

The circuit-data writing section 23 writes the circuit data into the circuit-data storing section 24. The circuit-data storing section 24 is a storing device such as a hard disk device, which stores the circuit data.

The test-pattern generating section 25 generates the test pattern that detects an error in the circuit. The test-pattern generating section 25 also learns the possible bit patterns of the syndromes in advance, so as to quickly detect a contradiction when the test pattern is generated.

The test-pattern generation section 25 includes an implication processing unit 26, an implication cancel unit 33, an error exciting unit 34, a J-frontier solving unit 35, and a D-frontier solving unit 36. The implication processing unit 26 performs implication processing when an error is excited in the circuit, to obtain a logic value on the output side from a logic value on the input side, or vice versa.

The implication processing unit 26 includes an ECC-EOR group setting unit 27, a possible-bit-pattern learning unit 28, an implication-processing executing unit 29, a request-value contradiction detecting unit 30, an exclusive-value implication determining unit 31 and a request-value propagation stopping unit 32.

The ECC-EOR group setting unit 27 extracts combinations of the EOR circuits $10a$ to $10d$ linked by the fan-out stems $11a$ to $11d$ in an error correcting circuit (hereinafter, "ECC"), and groups them together. The possible-bit-pattern learning unit 28 detects the possible bit patterns by the method described with FIG. 1, and stores them in the possible-bit-pattern data storing section 37.

The implication-processing executing unit 29 computes the logic value on the output side from the logic value on the input side of a gate, or vice versa, and then allocates the computed logic value to the output side or the input side.

When a request value is generated, the request-value contradiction detecting unit 30 determines whether the request value is included among the possible bit patterns.

When a part of a request value is generated, the exclusive-value implication determining unit 31 determines what the undetermined bit values are, by referring to the possible bit patterns.

Specifically, the exclusive-value implication determining unit 31 acquires the bit values of all possible bit patterns, corresponding to the same position of the undetermined bit value in the request value. When all of the bit values of the possible bit patterns are either "0" or "1", the undetermined bit value in the request bit pattern is determined to be "0" or "1".

When the request-value contradiction detecting unit 30 determines that a certain request value is included among the possible bit patterns, the request-value propagation stopping unit 32 temporarily stops propagating the request values. The request-value propagation stopping unit 32 then prioritizes the propagation of request values in other parts of the circuit.

The implication cancel unit 33 cancels a logic value set by the implication processing unit 26, when a cancel request is received.

The error exciting unit 34 excites an error in the circuit. The J-frontier solving unit 35 selects a J (Justify) frontier, which is a gate where a logic value is not yet determined. Then, the implication processing unit 26 performs implication processing for the J frontier. The J frontier solving is thus performed.

When the error excited by the error exciting unit 34 can be propagated, the D-frontier solving unit 36 selects a D (Difference) frontier, which is a gate not yet reached by the effect of the error. Then, the effect of the error is propagated to the D frontier. The D frontier solving is thus performed.

The possible-bit-pattern data storing section 37 is a storing device such as a hard disk device, which stores the possible bit patterns learned by the possible-bit-pattern learning unit 28.

FIG. 3 describes the possible bit patterns. The possible bit patterns 50a to 50c are stored for an ECC-EOR group 51.

The number of bits i of the possible bit patterns 50a to 50c is equal to the number of EOR circuits. The number of patterns j of the possible bit patterns 50a to 50c are in accordance with the degree of freedom n' of the number of bits of the syndromes s.

Returning to FIG. 2, the error-simulation execution section 38 acquires data of the test pattern generated by the test-pattern generating section 25, and executes an error simulation to extract the error that can be detected by the test pattern. The error-simulation execution section 38 then stores the data of the test pattern and the data of the error that can be detected by the test pattern, in the test-pattern-data storing section 39.

The test-pattern-data storing section 39 is a storing device such as a hard disk device, and coordinates the data of the test pattern with the data of the error that can be detected by the test pattern.

The test-pattern-data reading section 40 reads the data stored in the test-pattern-data storing section 39, and outputs the data to the display section 21 etc.

The control section 41 controls the entire bit-pattern learning apparatus, and commands exchange of data between each function.

FIG. 4 is a flowchart of a test-pattern generation processing.

First, the circuit-data reading section 22 reads data of a circuit from the circuit-data storing section 24 (step S101). The test-pattern generating section 25 automatically generates a test pattern that can detect an error excited in the circuit (step S102).

The error-simulation execution section 38 executes an error simulation to extract the error based on the generated test pattern (step S103). The test-pattern-data storing section 39 stores the data of the test pattern and the data of the error that can be detected by the test pattern (step S104).

The error-simulation execution section 38 determines whether all end conditions for the test pattern generation have been satisfied (step S105). The end conditions include whether a predetermined duration of time has passed, whether a predetermined detection rate is achieved, whether a predetermined number of test patterns has been generated, and so forth.

The detection rate refers to a ratio of the number of errors detected in the error simulation at step S103, to the number of listed errors read as circuit data at step S101.

If the end conditions are not satisfied ("No" at step S105), the processing returns to step S102, and follows the steps from there on. If the end conditions are satisfied ("Yes" at step S105), the circuit-data writing section 23 stores the data-concerning the test pattern generation in the circuit-data storing section 24 (step S106), and the test-pattern generation processing ends. The data concerning the test pattern generation means the time required for the test pattern generation, the detection rate, the number of test patterns generated, and so forth.

Figure 5A:
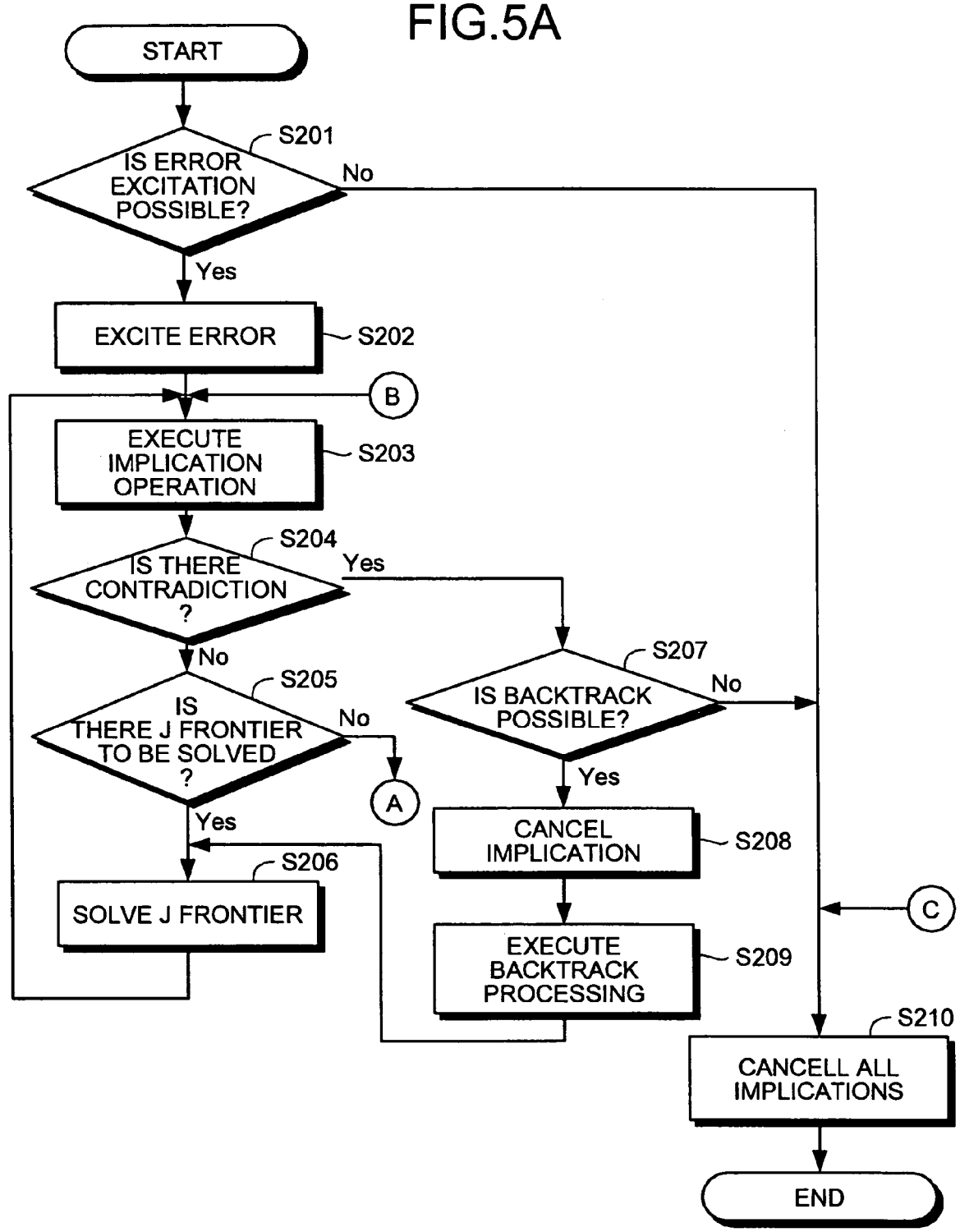

FIGS. 5A and 5B are flowcharts of a processing to automatically generate a test pattern, corresponding to step S102 in FIG. 4.

As shown in FIG. 5A, the error exciting unit 34 determines whether it is possible to excite an error in the circuit (step S201). If not ("No" at step S201), the implication cancel unit 33 cancels all implications (step S210), and the processing ends.

If it is possible to excite an error ("Yes" at step S201), the error exciting unit 34 excites an error (step S202), and the implication-processing executing unit 29 executes implication operation (step S203).

The implication-processing executing unit 29 then determines whether a contradiction is found during the implication operation (step S204). If a contradiction is found ("Yes" at step S204), it is determined whether backtrack processing is possible (step S207).

If backtrack processing is not possible ("No" at step S207), the implication cancel unit 33 cancels all implications (step S210), and the processing ends.

If backtrack processing is possible ("Yes" at step S207), the implication cancel unit 33 cancels the implication in which the contradiction is found (step S208). The J-frontier solving unit 35 performs backtrack processing, which means returning to the immediately preceding gate (step S209), and performs J frontier solving (step S206). Then, the processing returns to step S203, and follows the steps from there on.

If a contradiction is not found ("No" at step S204), the J-frontier solving unit 35 determines whether-there are any unsolved J frontiers (step S205). If there is an unsolved J frontier ("Yes" at step S205), the processing proceeds to step S206, and follows the steps from there on.

If there is no unsolved J frontier ("No" at step S205), the D-frontier solving unit 36 determines whether it is possible to observe the error (step S211). If it is possible to observe the error ("Yes" at step S211), the implication-processing executing unit 29 stores the implicated value as a test pattern (step S217). The processing returns to step S210 in FIG. 5A, and follows the steps from there on.

If it is not possible to observe the error ("No" at step S211), the D-frontier solving unit 36 determines whether there are any errors that can be propagated (step S212). If there is an error that can be propagated ("Yes" at step S212), the D-frontier solving unit 36 performs D frontier solving (step S213). The processing returns to step S203 in FIG. 5A, and follows the steps from there on.

If there is no error that can be propagated ("No" at step S212), the D-frontier solving unit 36 determines whether backtrack processing is possible (step S214).

If backtrack processing is not possible ("No" at step S214), the processing returns to step S210 in FIG. 5A, and follows the steps from there on. If backtrack processing is possible ("Yes" at step S214), the implication cancel unit 33 cancels the implication to which no errors can be propagated (step S215).

The D-frontier solving unit 36 performs backtrack processing (step S216). Then, the processing returns to step S213, and follows the steps from there on.

Next, the implication operation of step S203 in FIG. 5A will be described in detail with reference to FIGS. 6 through 11.

FIG. 6 is a flowchart of the possible-bit-pattern learning processing. First, the ECC-EOR group setting unit 27 extracts candidate EOR circuits included in the ECC circuit (hereinafter, "ECC-EOR circuit") (step S301), and groups together the combinations of ECC-EOR circuits that output syndromes (step S302).

The possible-bit-pattern learning unit 28 learns the possible bit patterns of the syndromes output from ECC-EOR circuits grouped together, and stores the possible bit patterns in the possible-bit-pattern data storing section 37 (step S303), and the processing ends.

FIG. 7 is a flowchart of a processing to extract candidate ECC-EOR circuits, corresponding to step S301 in FIG. 6. The ECC-EOR group setting unit 27 first selects an EOR circuit in the ECC circuit (step S401), and then selects an input terminal of the EOR circuit (step S402). The ECC-EOR group setting unit 27 then performs backtrace of the input terminal (step S403).

The ECC-EOR group setting unit 27 determines whether it is possible for the EOR circuit to reach a fan-out stem without passing a multi-input gate. (step S404). If it is possible ("Yes" at step S404), the ECC-EOR group setting unit 27 sets the EOR circuit as a candidate for an ECC-EOR circuit (step S405).

The ECC-EOR group setting unit 27 determines whether there is an unprocessed input terminal of the EOR circuit (step S406), and if there is one ("Yes" at step S406), the processing returns to step S402, and follows the steps from there on.

If there is no unprocessed input terminal ("No" at step S406), the ECC-EOR group setting unit 27 determines whether there are any unprocessed EOR circuits (step S407). If there is an unprocessed EOR circuit ("Yes" at step S407), the processing returns to step S401, and follows the steps from there on. If there is no unprocessed EOR circuit ("No" at step S407), the processing ends.

If it is determined that the EOR circuit cannot reach the fan-out stem ("No" at step S404), the processing proceeds to step S406, and follows the steps from there on.

FIG. 8 is a flowchart of a processing to group the ECC-EOR circuits, corresponding to step S302 in FIG. 6.

The ECC-EOR group setting unit 27 selects one of the ECC-EOR circuit candidates (step S501), and determines whether the input terminal of the ECC-EOR circuit candidate shares a fan-out stem with an input terminal of another ECC-EOR circuit candidate (step S502).

If a fan-out stem is shared ("Yes" at step S502), the ECC-EOR group setting unit 27 groups the ECC-EOR circuit candidates together (step S503).

The ECC-EOR group setting unit 27 determines whether there are any unprocessed ECC-EOR circuit candidates (step S504) and if there is one ("Yes" at step S504), the processing returns to step S501, and follows the steps from there on. If there is no unprocessed ECC-EOR circuit candidate ("No" at step S504), the processing ends.

If it is determined that the ECC-EOR circuit candidates do not share a fan-out stem ("No" at step S502), the processing proceeds to step S504, and follows the steps from there on.

FIG. 9 is a flowchart of a processing to store possible bit patterns, corresponding to step S303 in FIG. 6.

The possible-bit-pattern learning unit 28 selects a group of ECC-EOR circuits (step S601), and then searches all of the combinations of bit patterns of fan-out stems of the group (step S602).

The possible-bit-pattern learning unit 28 observes the bit patterns of the syndromes corresponding to the bit patterns of the fan-out stems (step S603), and selects one of the observed syndrome bit patterns (step S604).

The possible-bit-pattern learning unit 28 determines whether the same bit pattern as the selected syndrome bit pattern is included among the possible bit patterns stored in the possible-bit-pattern data storing section 37 (step S605).

If not ("No" at step S605), the possible-bit-pattern learning unit 28 stores the syndrome bit pattern in the possible-bit-pattern data storing section 37, as a possible bit pattern (step S606).

The possible-bit-pattern learning unit 28 determines whether there are any unselected syndrome bit patterns (step S607), and if there is one ("Yes" at step S607), the processing returns to step S604, and follows the steps from there on.

If there is no unselected syndrome bit pattern ("No" at step S607), the possible-bit-pattern learning unit 28 determines whether there are any unprocessed ECC-EOR circuit groups (step S608). If there is an unprocessed ECC-EOR circuit group ("Yes" at step S608), the processing returns to step S601, and follows the steps from there on. If there is no unprocessed ECC-EOR circuit group ("No" at step S608), the processing ends.

If it is determined that the same bit pattern as the selected syndrome bit pattern is included among the stored possible bit patterns ("Yes" at step S605), the processing proceeds to step S607, and follows the steps from there on.

Figure 10:
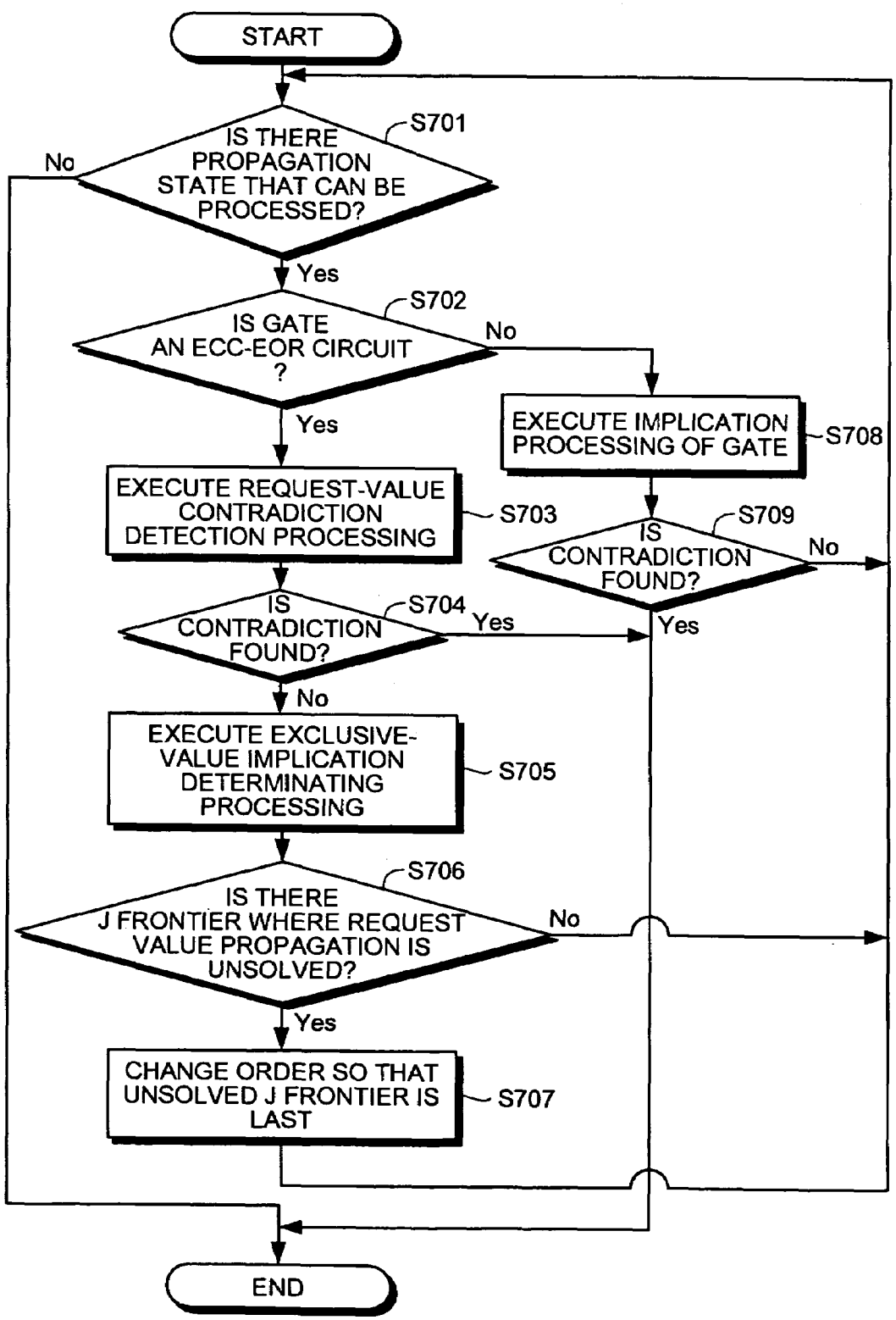
FIG. 10 is a flowchart of an implication processing.

FIG. 10 is a flowchart of the implication processing performed for the gates.

The implication-processing executing unit 29 determines whether there are any propagation states of a gate that can be processed (step S701). If not ("No" at step S701), the processing ends. If there is one ("Yes" at step S701), the implication-processing executing unit 29 determines whether the gate is an ECC-EOR circuit (step S702).

If the gate is not an ECC-EOR circuit ("No" at step S702), the implication-processing executing unit 29 executes implication processing for the gate (step S708), and determines whether a contradiction is found (step S709).

If a contradiction is found ("Yes" at step S709), the processing ends. If a contradiction is not found ("No" at step S709), the processing returns to step S701 and determines whether there is another propagation state of a gate that can be processed.

If the gate is an ECC-EOR circuit ("Yes" at step S702), the request-value contradiction detecting unit 30 executes a request-value contradiction detection processing (step S703). This processing will be described later with FIG. 11.

The request value contradiction detecting unit 30 determines whether a contradiction is found (step S704). If a contradiction is found ("Yes" at step S704), the processing ends.

If a contradiction is not found ("No" at step S704), the exclusive-value implication determining unit 31 executes an exclusive-value implication determining processing (step S705). This processing will be described later with FIG. 12.

The request-value propagation stopping unit 32 determines whether there are any unsolved J frontiers, to which the request value has not been propagated (step S706). If not ("No" at step S706), the processing returns to step S701, and follows the steps from there on.

If there is an unsolved J frontier ("Yes" at step S706), the request-value propagation stopping unit 32 changes the order so that the unsolved J frontier is solved last (step 707). Then, the processing returns to step S701, and follows the steps from there on.

Figure 11:
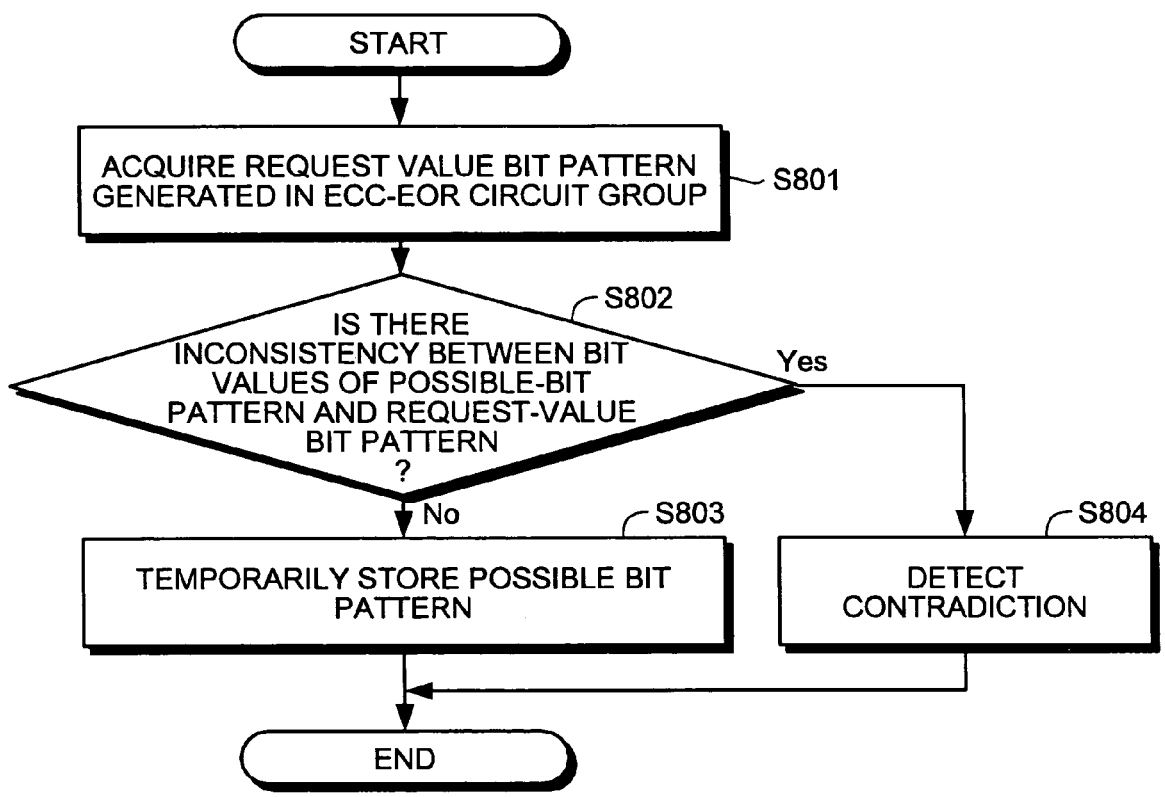
FIG. 11 is a flowchart of a request-value contradiction detection processing.

FIG. 11 is a flowchart of the request-value contradiction detection processing, corresponding to step S703 in FIG. 10.

The request-value contradiction detecting unit 30 acquires a bit pattern of a request value that is generated in the ECC-EOR circuit group (step S801).

The request-value contradiction detecting unit 30 determines whether there is an inconsistency between the bit values "0" or "1" of the possible bit patterns and the request value bit pattern (step S802).

If there is an inconsistency ("Yes" at step S802), the request-value contradiction detecting unit 30 determines that a contradiction is detected (step S804), and the processing ends.

If there is not an inconsistency ("No" at step S802), the request-value contradiction detecting unit 30 temporarily stores the possible bit pattern (step S803), and the processing ends.

Figure 12:
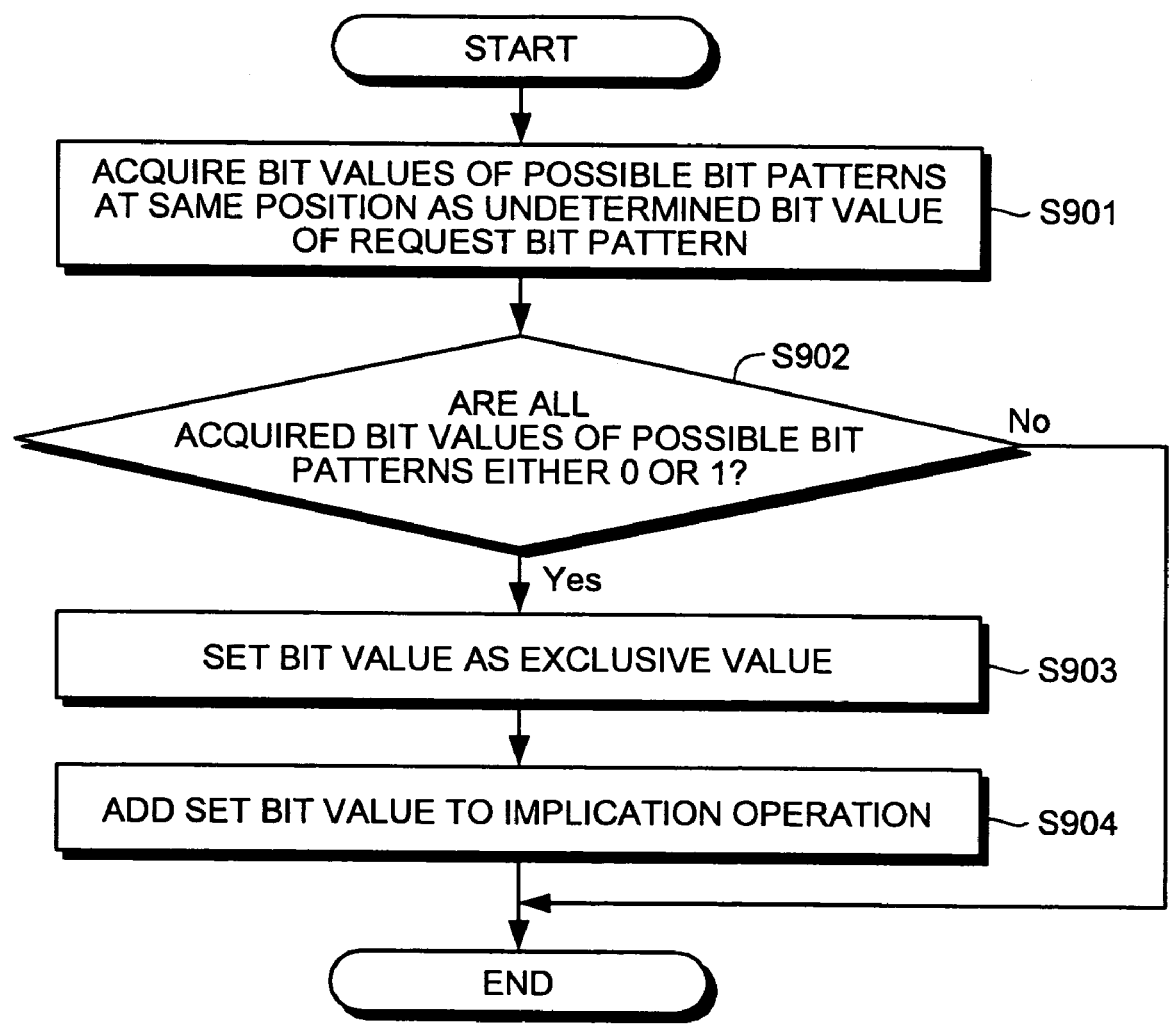
FIG. 12 is a flowchart of an exclusive-value implication determining processing.

FIG. 12 is a flowchart of the exclusive-value implication determining processing, corresponding to step S705 in FIG. 10.

A bit value that is not yet generated in the bit pattern of the requested value is determined as follows. The exclusive-value implication determining unit 31 acquires all bit values of the possible bit patterns in the same position as that of the undetermined bit value of the requested bit pattern (step S901).

The exclusive-value implication determining unit 31 determines whether all of the corresponding bit values in the possible bit patterns are either "0" or "1" (step S902). If not ("No" at step S902), the processing ends.

If all of the corresponding bit values in the possible bit patterns are either "0" or "1" ("Yes" at step S902), the exclusive-value implication determining unit 31 sets the undetermined bit value in the request bit pattern as either "0" or "1" (step S903).

The exclusive-value implication determining unit 31 provides the set bit value to the implication operation (step S904), and the processing ends.

Figure 13:
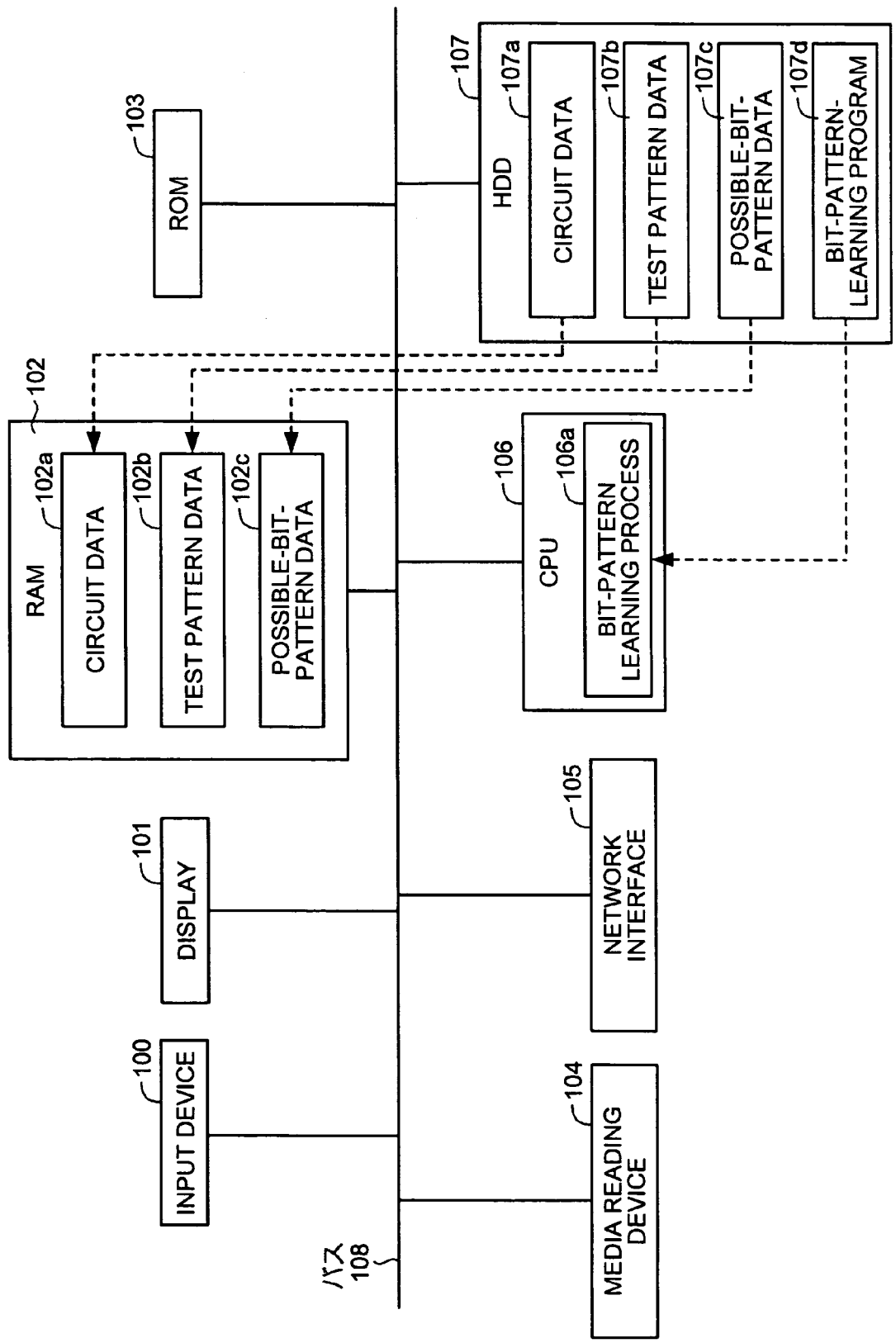
FIG. 13 illustrates a hardware configuration of a computer that corresponds to the bit-pattern learning apparatus.
Figure 14:
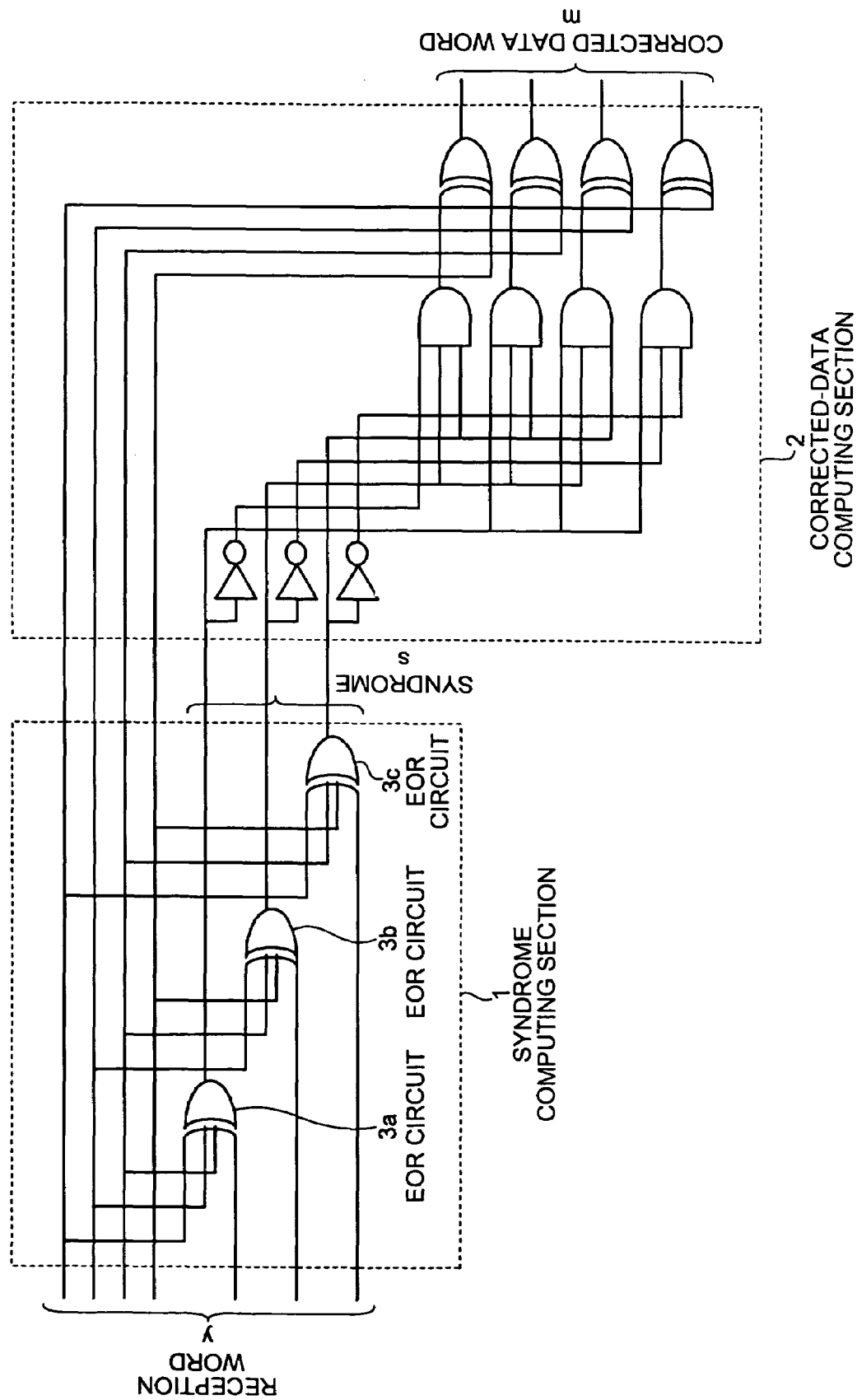
FIG. 14 describes an example of an error correcting circuit.

The process is realized by executing a computer program stored in a computer-readable recording medium. FIG. 13 describes a hardware configuration of an example of the computer, corresponding to the bit-pattern learning apparatus in FIG. 2.

The computer includes an input device 100 that receives data input by a user, a random access memory (RAM) 102, a read only memory (ROM) 103, a media reading device 104 that reads the program from the recording medium, a network interface 105 that exchanges data with another computer via a network, a central processing unit (CPU) 106, a hard disk drive (HDD),107, and a bus 108 that interconnects all of the above.

A bit-pattern-learning program 107d of FIG. 13 is stored in the HDD 107. The bit-pattern-learning program 107d can be stored in a distributed form.

The CPU 106 reads the bit-pattern-learning program 107d from the HDD 107 and executes it so as to function as a bit-pattern learning process 106a.

Figure 2:
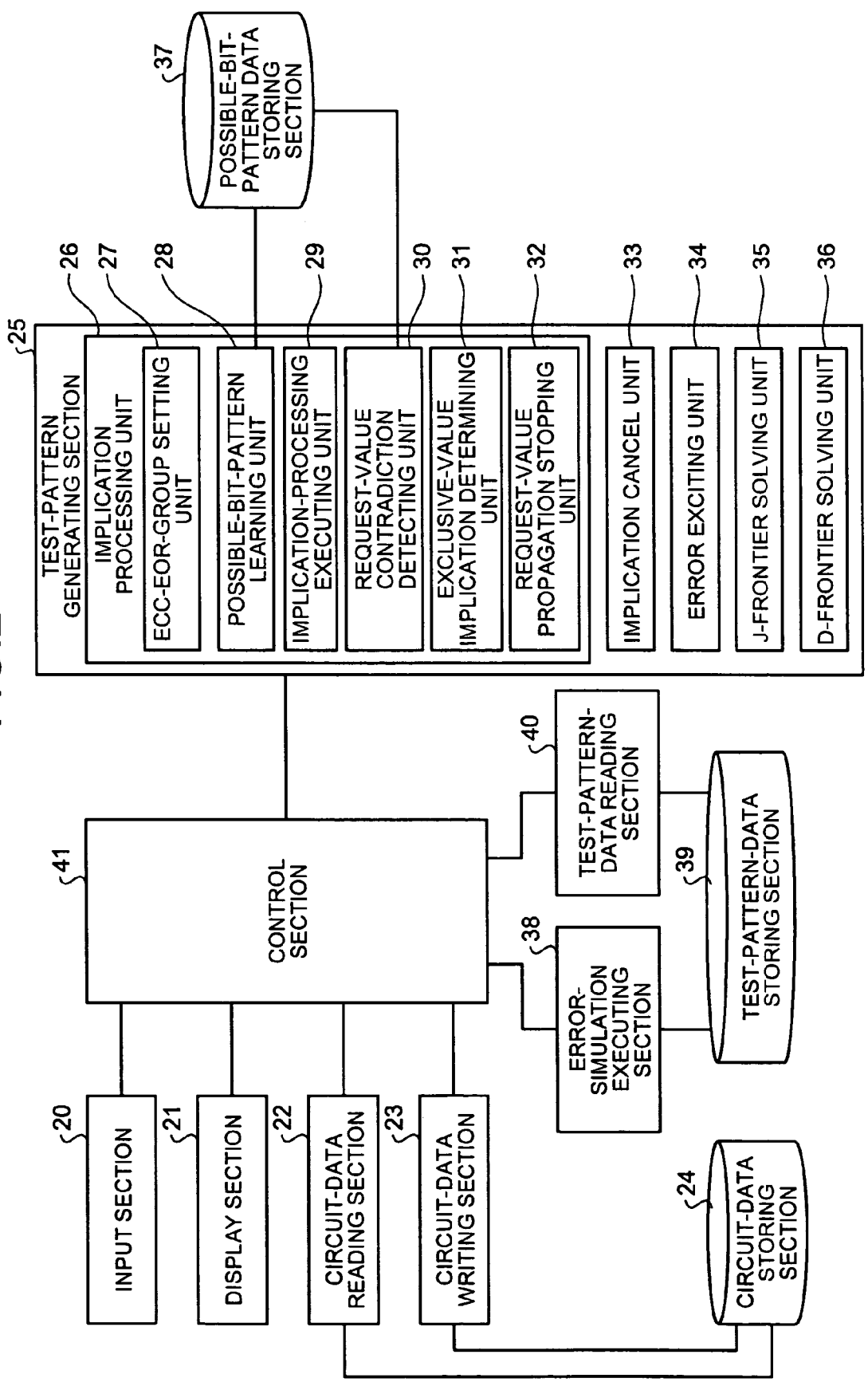
FIG. 2 is a bit-pattern learning apparatus according to an embodiment of the present invention.

The bit-pattern learning process 106a corresponds to the circuit-data reading section 22, the circuit-data writing section 23, the error-simulation execution section 38, the test-pattern generating section 25, and the test-pattern-data reading section 40 of FIG. 2.

Circuit data 107a, test pattern data 107b, possible-bit-pattern data 107c, and the bit-pattern learning program 107d are stored in the HDD 107. The circuit data 107a, the test pattern data 107b, and the possible-bit-pattern data 107c correspond to the circuit-data storing section 24, the test-pattern-data storing section 39, and the possible-bit-pattern data storing section 37 of FIG. 2, and the circuit data, the test pattern data, and the possible-bit-pattern data, stored respectively.

The CPU 106 stores the circuit data 107a, the test pattern data 107b, and the possible-bit-pattern data 107c in the HDD 107. At the same time, the CPU 106 reads the same from the HDD 107 and stores them in the RAM 102. Then, the CPU 106 executes various processings based on the data stored in the RAM 102.

According to the present embodiment, a test pattern to detect an error is generated efficiently, as follows.

The possible-bit-pattern learning unit 28 calculates the syndrome bit patterns corresponding to all of the candidate bit patterns input to the ECC-EOR circuits. The syndrome bit patterns calculated are stored as possible bit patterns in the possible-bit-pattern data storing section 37. In the implication processing, a request bit pattern only has to be compared with the possible bit patterns. Therefore, a contradiction can be quickly detected.

The request-value contradiction detecting unit 30 detects whether the request bit pattern generated for the circuit during test pattern generation is included among the possible bit patterns. Therefore, a contradiction can be quickly detected.

When it is determined that the request bit pattern is included among the possible bit patterns, the request-value propagation stopping unit 32 temporarily stops the propagation of the request bit pattern in the ECC-EOR circuit. Then, the propagation of the request bit patterns in other logic circuits is prioritized, where a contradiction can be found. Therefore, a contradiction can be found quickly and efficiently.

When a part of a request bit pattern matches a part of a possible bit pattern, the exclusive-value implication determining unit 31 determines the undetermined bit values of the request bit pattern by referring to all of the possible bit patterns. This step is performed when a contradiction was not found. As a result, the number of combinations of the logic values to be selected during the implication operation can be reduced.

The ECC-EOR group setting unit 27 groups together the EOR circuits connected by fan-out stems. The computer automatically detects this group, and learns the possible bit patterns calculated from all of the input bit patterns in this group. Thus, the computer does not have to extensively search the circuit, which leads to reduction in the time required for the test pattern generation.

It is difficult to generate a test pattern for the ECC, because the EOR circuits in the ECC share an input value. However, the present invention can generate a test pattern efficiently, as the EOR circuits in the ECC are set as objects of the possible-bit-pattern learning.

According to the present invention, the following effects are obtained. That is, a test pattern to detect an error is generated efficiently, a contradiction can be quickly detected while the test pattern is generated, a number of combinations of logic values to be selected during implication operation is reduced, and the time required for the test pattern generation is reduced.

The possible-bit-pattern learning process of the present embodiment can also be applied to any logic circuit other than EOR circuits in an ECC.

All the automatic processes explained in the present embodiment can be, entirely or in part, carried out manually. Similarly, all the manual processes explained in the present embodiment can be entirely or in part carried out automatically by a known method.

The sequence of processes, the sequence of controls, specific names, and data including various parameters can be changed as required unless otherwise specified.

The constituent elements of the bit pattern learning apparatus illustrated are merely conceptual and may not necessarily physically resemble the structures shown in the drawings. For instance, the apparatus need not necessarily have the structure that is illustrated. The apparatus as a whole or in parts can be broken down or integrated either functionally or physically in accordance with the load or how the apparatus is to be used.

The process functions performed by the apparatus are entirely or partially realized by the CPU or a program executed by the CPU or by a hardware using wired logic.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A computer-readable recording medium that stores therein a computer program that causes a computer to execute:
   calculating output bit patterns for all candidate bit patterns that are input in a logic circuit; and
   storing the output bit patterns calculated, thereby learning the output bit patterns.

2. The computer-readable recording medium according to claim 1, wherein the computer program further causes the computer to execute:
   determining whether same bit pattern as a request bit pattern allocated to-the output bit patterns is included among the output bit patterns stored, wherein the request bit pattern is propagated when an error occurs in the logic circuit.

3. The computer-readable recording medium according to claim 2, wherein the computer program further causes the computer to execute:
   stopping temporarily the propagation of the request bit patterns in the logic circuit, when it is determined that the same bit pattern as the request bit pattern is included among the output bit patterns stored; and
   propagating the request bit patterns in another logic circuit.

4. The computer-readable recording medium according to claim 2, wherein the computer program further causes the computer to execute:
   deciding whether a part of the request bit pattern matches a part of the output bit pattern; and
   determining an undetermined bit value of the request bit pattern based on bit values of the output bit patterns stored, when it is determined at the deciding that a part of the request bit pattern matches a part of the output bit pattern.

5. The computer-readable recording medium according to claim 1, wherein the computer program further causes the computer to execute:
   setting a logic circuit including combinations of Exclusive OR circuits linked by a fan-out stem, as an object of output-bit-pattern learning; and
   calculating output bit patterns for all candidate bit patterns that are input in all of the combinations of the Exclusive OR circuits.

6. The computer-readable recording medium according to claim 1, wherein the logic circuit includes a plurality of Exclusive OR circuits, and a plurality of logic circuits are included in an error correcting circuit.

7. A bit-pattern learning apparatus comprising:
   a calculating unit that calculates output bit patterns for all candidate bit patterns, wherein the candidate bit patterns are input in a logic circuit; and
   a storing unit that stores the output bit patterns calculated, thereby causing a computer to learn the output bit patterns.

8. The bit-pattern learning apparatus according to claim 7, further comprising:
   a request-value contradiction detecting unit that detects whether same bit pattern as a request bit pattern allocated to the output bit patterns is included among the output bit patterns stored, wherein the request bit pattern is propagated when an error occurs in the logic circuit.

9. The bit-pattern learning apparatus according to claim 8, further comprising:
   a request-value propagating/stopping unit-that temporarily stops the propagation of the request bit patterns in the logic circuit, when it is determined that the same bit pattern as the request bit pattern is included among the output bit patterns stored, and propagates the request bit patterns in another logic circuit.

10. The bit-pattern learning apparatus according to claim 8, further comprising:
    an exclusive-value implication determining unit that determines whether a part of the request bit pattern matches a part of the output bit pattern, and determines an undetermined bit value of the request bit pattern based on bit values of the output bit patterns stored, when it is determined that a part of the request bit pattern matches a part of the output bit pattern.

11. The bit-pattern learning apparatus according to claim 7, further comprising:
    an ECC-EOR-group setting unit that sets a logic circuit including combinations of Exclusive OR circuits linked by a fan-out stem, as an object of output-bit-pattern learning; and
    a possible-bit-pattern learning unit that learns output bit patterns for all candidate bit patterns that are input in all of the combinations of the Exclusive OR circuits.

12. The bit-pattern learning apparatus according to claim 7, wherein the logic circuit includes a plurality of Exclusive OR circuits, and a plurality of logic circuits are included in an error correcting circuit.

13. A bit-pattern learning method comprising:
    calculating output bit patterns for all candidate bit patterns that are input in a logic circuit; and
    storing the output bit patterns calculated, thereby learning the output bit patterns.

14. The bit-pattern learning method according to claim 13, further comprising:
    determining whether same bit pattern as a request bit pattern allocated to the output bit patterns is included among the output bit patterns stored, wherein the request bit pattern is propagated when an error occurs in the logic circuit.

15. The bit-pattern learning method according to claim 14, further comprising:
stopping temporarily the propagation of the request bit patterns in the logic circuit, when it is determined that the same bit pattern as the request bit pattern is included among the output bit patterns stored; and
propagating the request bit patterns in another logic circuit.

16. The bit-pattern learning method according to claim 14, further comprising:
deciding whether a part of the request bit pattern matches a part of the output bit pattern; and
determining an undetermined bit value of the request bit pattern based on bit values of the output bit patterns stored, when it is determined at the deciding that a part of the request bit pattern matches a part of the output bit pattern.

17. The bit-pattern learning method according to claim 13, further comprising:
setting a logic circuit including combinations of Exclusive OR circuits linked by a fan-out stem, as an object of output-bit-pattern learning; and
calculating output bit patterns for all candidate bit patterns that are input in all of the combinations of the Exclusive OR circuits.

18. The bit-pattern learning method according to claim 13, wherein the logic circuit includes a plurality of Exclusive OR circuits, and a plurality of logic circuits are included in an error correcting circuit.

* * * * *

UNITED STATES PATENT AND TRADEMARK OFFICE
CERTIFICATE OF CORRECTION

PATENT NO. : 7,246,292 B2
APPLICATION NO. : 11/093244
DATED : July 17, 2007
INVENTOR(S) : Daisuke Maruyama It is certified that error appears in the above-identified patent and that said Letters Patent is hereby corrected as shown below:

Column 11, Line 45, change "to-the" to --to the--.

Column 12, Line 31, change "unit-that" to --unit that--.

Signed and Sealed this

Eighteenth Day of December, 2007

JON W. DUDAS
*Director of the United States Patent and Trademark Office*